(12) United States Patent
Supriya et al.

(10) Patent No.: US 8,173,259 B2
(45) Date of Patent: May 8, 2012

(54) METHODS TO FABRICATE FUNCTIONALLY GRADIENT MATERIALS AND STRUCTURES FORMED THEREBY

(75) Inventors: Lakshmi Supriya, Chandler, AZ (US); Linda A. Shekhawat, Tucson, AZ (US)

(73) Assignee: Intel Corporation, Santa Clara, CA (US)

( * ) Notice: Subject to any disclaimer, the term of this patent is extended or adjusted under 35 U.S.C. 154(b) by 1197 days.

(21) Appl. No.: 11/863,122

(22) Filed: Sep. 27, 2007

(65) Prior Publication Data

US 2009/0087644 A1    Apr. 2, 2009

(51) Int. Cl.
*B32B 5/66* (2006.01)
(52) U.S. Cl. .......................... 428/403; 428/323; 428/407
(58) Field of Classification Search .................. 428/403, 428/407, 323
See application file for complete search history.

(56) References Cited

U.S. PATENT DOCUMENTS

| | | | |
|---|---|---|---|
| 7,309,658 B2 * | 12/2007 | Lazovsky et al. | 438/754 |
| 7,465,497 B2 * | 12/2008 | Tan et al. | 428/403 |
| 2007/0190100 A1 * | 8/2007 | Shastri et al. | 424/422 |
| 2010/0240804 A1 * | 9/2010 | Irwin et al. | 523/216 |

* cited by examiner

*Primary Examiner* — Leszek Kiliman
(74) *Attorney, Agent, or Firm* — Kathy J. Ortiz

(57) ABSTRACT

Methods and associated structures of forming microelectronic devices are described. Those methods may include forming a first layer of functionalized nanaparticles on a substrate by immersing the substrate in at least one of a solvent and a polymer matrix, wherein at least one of the solvent and the polymer matrix comprises a plurality of functionalized nanoparticles; and forming a second layer of functionalized nanoparticles on the first layer of functionalized particles, wherein there is a gradient in a property between the first layer and the second layer.

7 Claims, 5 Drawing Sheets

METHODS TO FABRICATE FUNCTIONALLY GRADIENT MATERIALS AND STRUCTURES FORMED THEREBY

BACKGROUND OF THE INVENTION

In packaging applications, materials with different properties are often put together. This may create a mismatch in properties between the materials, which may lead to reliability failures. Some examples of this mismatch include the coefficient of thermal expansion (CTE) mismatch that may occur during attachment of a silicon die to an organic substrate, and adhesion of materials with different properties such as underfill materials and copper to solder.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

FIGS. 1a-1e represent structures according to an embodiment of the present invention.

DETAILED DESCRIPTION OF THE PRESENT INVENTION

Figure 1D:
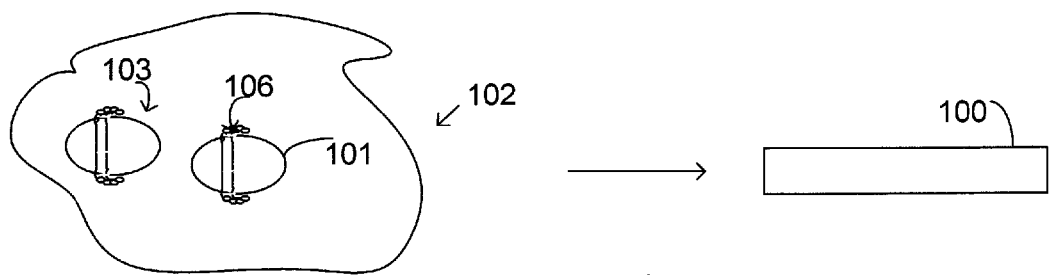
Figure 1D:
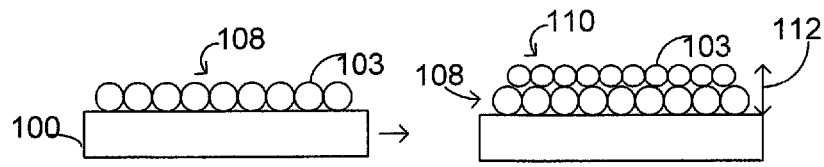
Figure 1D:
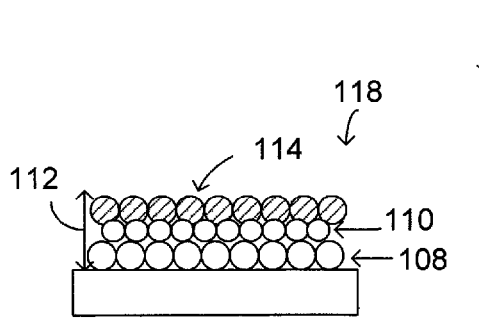

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming microelectronic structures are described. Those methods may include forming a first layer of functionalized nanoparticles on a substrate by immersing the substrate in at least one of a solvent and a polymer matrix, wherein at least one of the solvent and the polymer matrix comprises a plurality of functionalized nanoparticles, and forming a second layer of functionalized nanoparticles on the first layer of functionalized nanoparticles, wherein there is a gradient in a property between the first layer and the second layer. Methods of the present invention enable materials with completely different properties to be joined together very easily. These methods may also serve to eliminate problems such as filler settling when using underfill materials in package applications.

FIGS. 1a-1e illustrate embodiments of methods for fabricating materials comprising a gradient of properties by utilizing self-assembly techniques and interpenetrating networks, for example. FIG. 1a illustrates a portion of a substrate 100. The substrate 100 may comprise at least one of a package substrate, and a copper surface. The substrate 100 may include any such substrate that may be mated to another substrate, such as but not limited to silicon dies mated to organic substrates/surfaces that may comprise different thermal conductivities, and underfill surfaces mated to copper/solder surfaces.

The substrate 100 may be immersed in at least one of a solvent and a polymer matrix 102. In one embodiment, the at least one of a solvent and polymer matrix 102 may comprise a plurality of functionalized nanoparticles 103 that may be dispersed in the solvent and/or polymer matrix 102. In some embodiments the functionalized nanoparticle 103 may include but is not limited to silica and/or alumina nanoparticles, wherein the surface chemistry of the at least one nanoparticle may be functionalized, and may comprise a functional group 106. The functional group 106 may comprise such functional groups as thiols, silanes, ammonium—silane salts, silane coupling agents and/or other such polymers which have good adhesion with copper and under-fill materials, for example. In general the adhesion requirements of the functional group 106 will depend upon the particular application.

The nanoparticles 101 may comprise a range of different sizes, and in some cases may comprise a size of about 1-2 nanometers to above about a micron in size. In one embodiment, the functionalized nanoparticles 103 may be assembled using a layer-by-layer assembly method, wherein the substrate 100 may be immersed in the solvent and/or polymer matrix 102. The functionalized nanoparticles 103 may then attach to the substrate 100 (FIG. 1b). This process may be repeated using either the same size nanoparticles 101, or nanoparticles 101 with different sizes to form a film comprising a plurality of layers. In one embodiment, the layers of functionalized nanoparticles 103 may comprise different properties.

For example, in one embodiment, a first layer 108 of functionalized nanoparticles 103 may be formed on the substrate 100. A second layer 110 of functionalized nanoparticles 103 may then be formed on the first layer 108 of functionalized particles 103, wherein there may comprise a property gradient 112, which may comprise a gradient in a particular and/or a group of properties between the first layer 108 and the second layer 110, and may carry through to any successive layers that may be further layered upon the second layer 110 (FIG. 1c). In one embodiment, the property(s) may comprise at least one of a coefficient of thermal expansion gradient, a modulus gradient, a toughness gradient, a work function gradient, an adhesion gradient, and a thermal conductivity gradient, by illustration and not limitation.

The particular property gradient chosen may depend upon the particular application. In one embodiment, a third layer 114 may be added to the second layer 110 and so on, such that a plurality of layers may be achieved (according to the particular application) by utilizing the layer by layer self assembly method to form a composite film 118 (FIG. 1d). The layers may be in sequence and/or may be alternated with each other according to the particular application. The total number of layers and materials used for each layer of the composite film 118 will depend upon the particular application, and the number of layers is not restricted to three, as depicted in the figure. In one embodiment, the individual layers of functionalized nanoparticles 103 may be chosen such that adhesion between the layers is enhanced, and functionalization may be chosen so that little to no diffusion occurs across the composite film 118 that may tend to reduce or obliterate the property gradient 112.

Figure 1E:
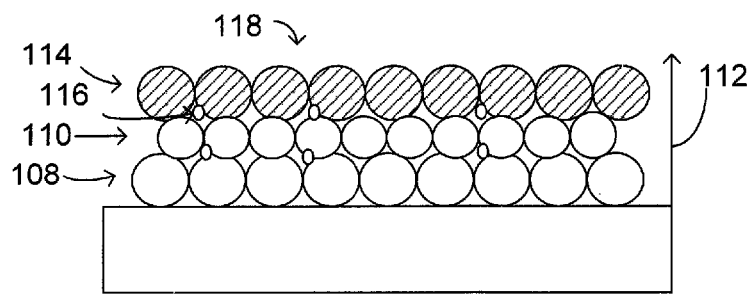

In another embodiment, the composite film 118 may comprise at least one small organic linker molecule 116 such as mercaptoethanol, ethanedithiol, 1,6-hexanedithiol etc. that may enhance the affinity of the different layers to each other when assembled together (FIG. 1e). In one embodiment, the layers of the composite film 118 may comprise functionalized nanoparticles 103 that may comprise titania, silica, gold, silver and combinations thereof. The functionalized nanoparticles 103 may be neat or dispersed in solvents and/or a resin matrix.

The functionalized nanoparticles 103 may be of the same size or different sizes. The functionalized nanoparticles 103 may be assembled in a layer-by-layer method by immersing the substrate 100 in a dispersion of the functional nanoparticles as described previously. In one embodiment, the various layers may be grown such that each functionalized nanoparticle layer may be a few monolayers thick, and different functionalized nanoparticle layers may be chosen for each successive layer such that the properties form the gradient 112 across the composite film 118.

In another embodiment, the functionalized nanoparticles 103 may comprise metallic nanoparticles such as gold, silver, platinum, palladium, cobalt and combinations thereof. The functionalized metallic nanoparticles may be dispersed in a solvent or polymer matrix. The functionalized metallic nanoparticles 103 may be assembled in a layer-by-layer manner such that the composite 118 film may comprise a gradient of work functions, in some embodiments.

Figure 2A:
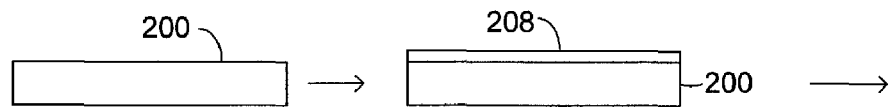
FIGS. 2a-2i represent structures according to an embodiment of the present invention.

In another embodiment, a composite film may comprise layers of polymers such as epoxy, polyester, polyimides, polycarbonate etc. In an embodiment, the polymer layers may comprise homogeneous polymers and/or block copolymers such as polyolefins, polyanilines, polymer particles (core-shell particles) and magnetic nanoparticles. The polymers may be neat or may comprise filler particles such as silica, titania, etc. in various compositions. In one embodiment, a layer of a first polymer material 208 may be formed on a substrate 200 by spin coating the material on the substrate 200 (FIG. 2a).

Figure 2B:
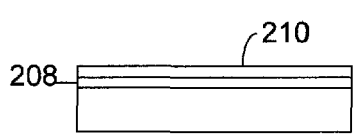

A layer of a second polymer material 210 may be formed on the layer of the first polymer material 208 by spin coating the layer of the second polymer material 210 on the layer of the first polymer material 208 (FIG. 2b). In one embodiment, each of the layers may comprise a different polymer and/or each polymer may be a few monolayers thick (below about 40 angstroms). In one embodiment, the thickness of at least one of the layers may range between about 1 nm to about 500 nm.

Figure 2C:
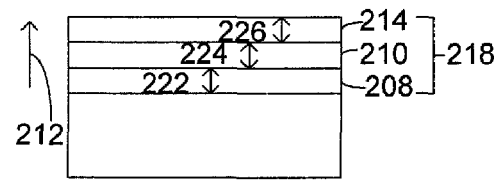

A third layer of a third polymer material 214 may be added to the second layer of the second polymer material 210 and so on, such that a plurality of layers may be achieved (according to the particular application) by utilizing the spin coating method to form a composite film 218 (FIG. 2c). In one embodiment, a property gradient 212 may exist between the layers of the composite film 218. In another embodiment, the layers of the composite film 218 may be deposited by printing the materials on the surface with a stencil. The stencil may be unpatterned, or patterned. Materials for each layer of the composite film 218 may be chosen such that there is a continuous gradation in the property(s) of the layers.

The layers may be chosen such that the property gradient 212 may comprise at least one of a coefficient of thermal expansion gradient, a modulus gradient, a toughness gradient, a work function gradient, an adhesion gradient, and a thermal conductivity gradient, by illustration and not limitation. In one embodiment, the composite 218 may be cured after fabrication. In one embodiment, a thickness 222, 224, 226 of at least one of the layers 208, 210, 214 may comprise less than about 100 nm.

Figure 2D:
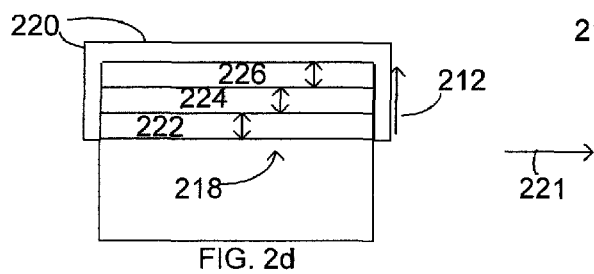
Figure 2E:
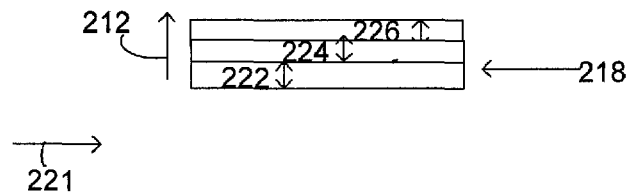

In one embodiment, the composite film 218 may be coated with a release agent 220 such as teflon, or fluorinated silanes etc. (FIG. 2d). The composite film 218 may be cured and released 221 from the substrate to form a free-standing composite film 218 with gradient properties (FIG. 2e). In another embodiment, instead of comprising a flat substrate 200, the substrate 200 (and the substrate 100 in previous embodiments) may comprise some patterns or topography, and may comprise a mold to fabricate the composite films in a variety of shapes and surface structures, depending upon the various embodiments.

Figure 2F:
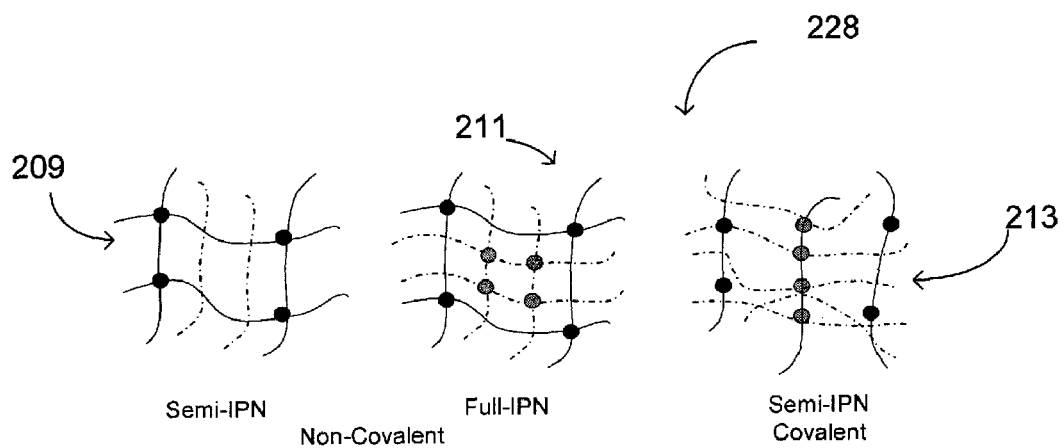

In another embodiment, at least one of the layers of the composite film 218 may comprise an interpenetrating network (IPN) 228 (FIG. 2f). In one embodiment, IPN's 228 may comprise any two materials each in a network form. Several types of IPNs exist. For example, IPN's may comprise semi-IPN's 209 or full IPN's 211. Semi IPNs comprise two different polymers such that only one of the polymers is crosslinked (non-covalent semi IPNs) or systems where both the polymers are crosslinked to form a single polymer network (covalent semi IPNs 213). Full IPNs may comprise of systems where two separate polymers are crosslinked independently. In one embodiment, IPN's may be covalently and/or non-covalently bonded to each other, wherein the IPN's may comprise thermosetting resins that may comprise at least one of epoxy and cyanate esters, block copolymers and silicate chains comprising supercritical $CO_2$ in some embodiments.

The IPN's may be chosen and layered on each other to achieve a wide variety of properties amongst the different layers, such that the gradient 212 may be varied depending upon the particular application. In one embodiment, the IPN's may comprise polymers comprising thermoplastic/thermoset polymers, thermoset/thermoset polymers or inorganic/organic materials and combinations thereof. In one embodiment, two noncovalently bonded IPNs polymers may be interwoven with substantially no chemical bonds formed between the two.

Figure 2G:
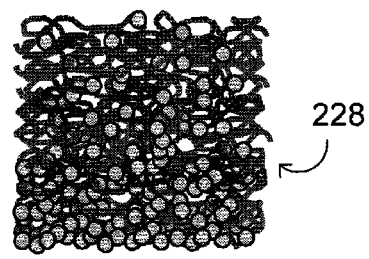

In another embodiment, improved mechanical performance may be achieved when at least one layer of the composite film 218 comprises a semi-covalently bonded IPN. One example of a semi-covalently bonded IPNs is a silica-epoxy hybrid (FIG. 2g). A sol-gel method may be utilized to fabricate the silica-epoxy IPN layer. In another embodiment, the interpenetrating networks 228 may comprise amphiphilic block copolymers chains and inorganic silicate chains using supercritical $CO_2$ which comprise low coefficients of thermal expansion (CTE) thermoplastics materials.

Mesoporous silica may be formed in the hydrophobic core of a poly(ethylene oxide)-b-poly(propylene oxide)-b-poly (ethylene oxide) in triblock copolymers, for example, by using a supercritical carbon dioxide infusion/reaction technique. Block copolymers may be incorporated to serve as micellar templates wherein the silica can form in well-defined cores. The films may be prepared by spin coating or casting at elevated temperatures. The supercritical carbon dioxide may be introduced by infusion techniques.

In one embodiment, phase morphology may be controlled and uniformly dispersed silica in epoxy may be formed. This degree of freedom in the materials allows for a high level of control over the resulting properties including Tg (glass transition temperature), CTE, toughness, and elongation.

Figure 2H:
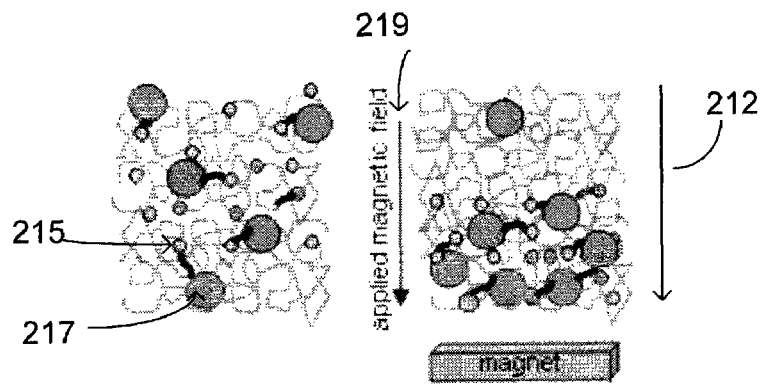

In another embodiment, at least one layer of the composite film 218 may comprise magnetic nanoparticles 215 that may contain surface functionalization that can covalently bond to a silica filler 217 surface chemistry and pendant chains on an epoxy resin, wherein the property gradient 212 may be formed by ordering the location of the silica micro-filler within the polymer films by utilizing applied magnetic fields 219 (FIG. 2h). The gradient property 212 may be formed by ordering the location of the silica micro-filler 217 using the magnetic nanoparticles 215 by using the applied magnetic fields 219. The magnetic nanoparticles 215 may contain surface functionalization that can covalently bond to the silica filler 217 surface chemistry and pendant chains on the epoxy resin.

Figure 2I:
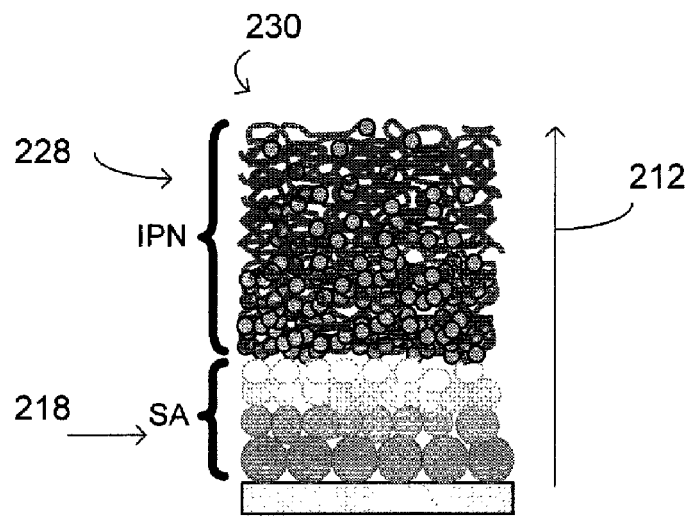

In one embodiment, the property gradient 212 may be achieved by layering at least one layer of interpenetrating network 228 sequentially added onto the self assembled composite film 218 (FIG. 2i) to form a hybrid film 230. In one embodiment, the formation of a relatively long spatial range of gradient 212 properties can be achieved by this method. In one embodiment, the subsequent layers formed of interpenetrating networks 228 can be applied to the initial layers by spin coating and other film forming methods. A critical parameter for these IPNs is their chemical composition. The gradient 212 may be controlled by the concentration of silica precursor in the mixture and the types of epoxy resins (aliphatic or aromatic, monomer or chain-extended) selected. The property gradient can be further modified by incorporation of additives such as core-shell impact modifiers, hyperbranched polymers, dendrimers, rubber elastomers and combinations thereof.

Figure 3A:
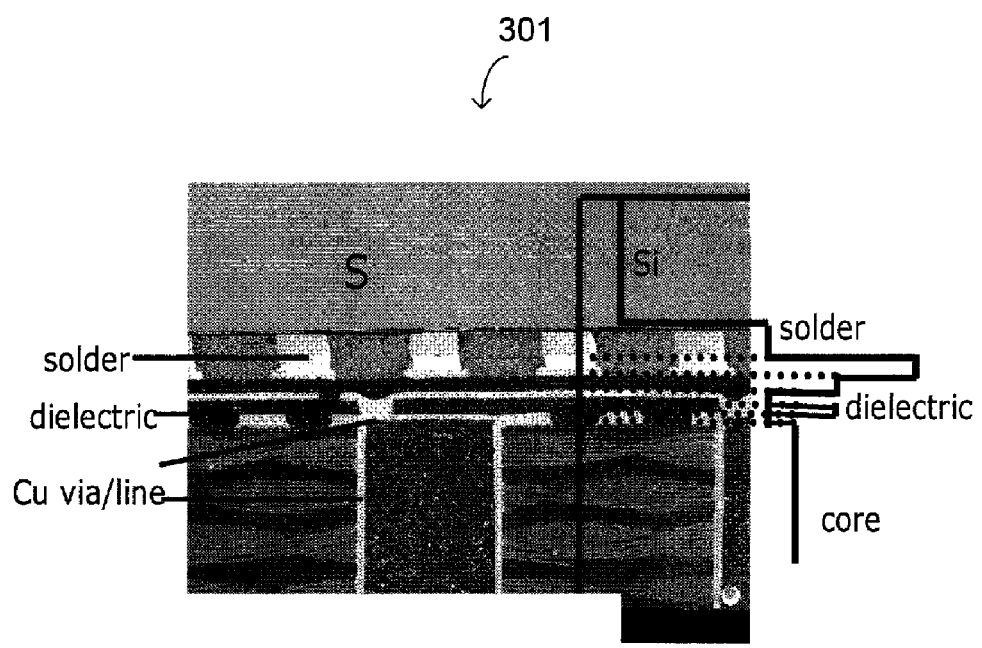
FIG. 3a-3b represent structures according to an embodiment of the present invention.
Figure 3B:
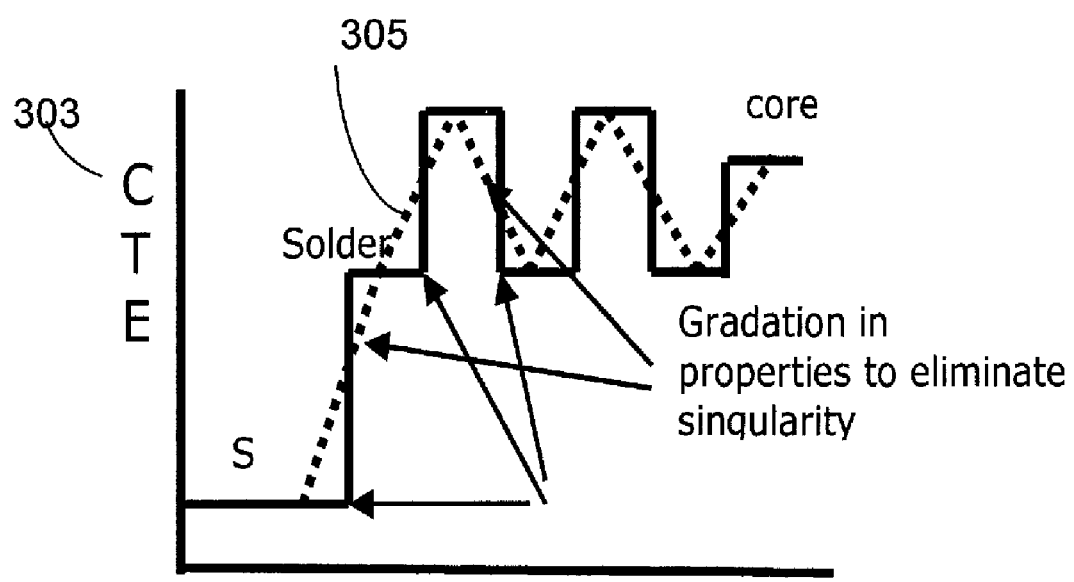

FIG. 3a depicts a cross-sectional view of a microelectronic structure 301, which may comprise a portion of package, for example, and may comprise silicon, solder, dielectric, copper and core regions. In some embodiments, the various interfaces between the different materials may result in abrupt changes in physical properties. FIG. 3b depicts a graph of how one physical property, in this case the CTE 303, might be affected at interface locations between the different materials. Such sharp changes in physical properties at these interfaces may cause failures in package structures. By utilizing the materials, films and structures possessing the gradation in properties of the various embodiments of the present invention, sharp interfaces at the material interface may be minimized if not eliminated, thus greatly improving performance and reliability of devices, packages and structures employing the methods of the present invention. While FIG. 3b depicts the gradation in the CTE property 305, it will be understood that gradation of any chosen property may be achieved utilizing the methods and structures of the present invention.

Thus, benefits of the present invention include but are not limited to enabling the joining of materials that have different properties, such that a gradation in at least one physical property is achieved in order to minimize reliability issues. This may be achieved by methods such as utilizing different particle sizes and different surface functionality on the particles, and using films with different chemical structures such that the a property gradient may be formed. Layer-by-layer assembly of materials with different properties enables the formation of functionally gradient materials. Additionally, self assembly techniques coupled with the formation of interpenetrating networks in a sequential manner may serve to generate a gradient of material properties from a bottoms-up method.

Different interactions may be used to attach the different layers such as covalent interactions, electrostatic interactions etc. The present invention comprises materials fabricated with gradient properties such that on one side the properties match a first material, such as a solder material for example, and on the other side the properties match a second material, such as an underfill material for example, with a gradient of properties in the middle between the first material and the second material. The fabrication of such materials will enable materials with completely different properties to be mated to each other very easily. The methods and structures of the various embodiments may serve to eliminate problems such as filler settling in underfill materials, for example.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that certain aspects of microelectronic devices, such as a microelectronic packages, are well known in the art. Therefore, it is appreciated that the Figures provided herein illustrate only portions of an exemplary microelectronic device that pertains to the practice of the present invention. Thus the present invention is not limited to the structures described herein.

What is claimed is:

1. A structure comprising:
   a first layer of at least one of a plurality of functionalized nanoparticles and polymer material disposed on a substrate, wherein the first layer comprises a physical property; and
   a second layer of at least one of a plurality of functionalized nanoparticles and polymer material disposed on the first layer, wherein the first layer comprises the physical property, and wherein at least one of the first layer and the second layer of functionalized nanoparticles comprises metallic functionalized nanoparticles; and
   a property gradient extending from the first layer to the second layer.

2. The structure of claim 1 wherein the functionalized nanoparticles comprise at least one of small organic linker molecule comprising mercaptoethanol, ethanedithiol, 1,6-hexanedithiol, metal nanoparticles and combinations thereof.

3. The structure of claim 1 wherein the property gradient comprises at least one of a coefficient of temperature gradient, a modulus gradient, a thermal conductivity gradient, work function gradient, toughness gradient, material concentration gradient and an adhesion gradient and combinations thereof.

4. The structure of claim 1 wherein a thickness of at least one of the first layer and the second layer comprises less than about 100 nm.

5. The structure of claim 1 further comprising additional layers of the first layer and the second layer alternately stacked on each other, wherein the property gradient exists across the total number of layers of the composite film.

6. The structure of claim 1 wherein the at least one of the first layer and the second layer comprises at least one of epoxy, polyester, polyimides, polycarbonate and combinations thereof.

7. The structure of claim 1 wherein at least one of the first layer and the second layer comprises at least one of an interpenetrating network of thermosetting resins, an epoxy, cyanate esters, block copolymers and silicate chains using supercritical $CO_2$.

* * * * *